United States Patent [19]

Sorin

[11] Patent Number: 4,914,665
[45] Date of Patent: Apr. 3, 1990

[54] BROADBAND-TUNABLE EXTERNAL FIBER-CAVITY LASER

[75] Inventor: Wayne V. Sorin, Mountain View, Calif.

[73] Assignee: Hewlett-Packard Company, Palo Alto, Calif.

[21] Appl. No.: 5,494

[22] Filed: Jan. 20, 1987

[51] Int. Cl.$^4$ ............................ G02B 6/26; H01S 3/10
[52] U.S. Cl. ..................................... 372/20; 350/96.15
[58] Field of Search ............................ 372/20, 92, 94; 350/96.15, 96.18, 96.19

[56] References Cited

U.S. PATENT DOCUMENTS

| | | | |
|---|---|---|---|
| 3,995,937 | 12/1976 | Baues et al. | 350/96.12 |
| 4,268,116 | 5/1981 | Schmadel et al. | 350/96.19 |
| 4,536,058 | 8/1985 | Shaw et al. | 350/96.15 |
| 4,622,663 | 11/1986 | Ishikawa et al. | 350/96.19 |
| 4,676,585 | 6/1987 | Shaw et al. | 350/96.15 |
| 4,688,882 | 8/1987 | Failes | 350/96.15 |

FOREIGN PATENT DOCUMENTS

| | | | |
|---|---|---|---|
| 0216565 | 4/1987 | European Pat. Off. | 350/96.19 |
| 2442652 | 3/1976 | Fed. Rep. of Germany | 350/96.19 |

OTHER PUBLICATIONS

Bulmer et al; "Single Mode . . . Optical Waveguides"; IEEE Journal of Quantum Electronics, vol. QE-14, No. 10, 10/1978; pp. 741-749.

Bergh et al; "Single Mode . . . Coupler"; Electronics Letters, Mar. 27, 1980; vol. 16, No. 7; pp. 260-261.

Brinkmeyer et al; "Fibre Bragg . . . Lasers"; Electronics Letters; vol. 22, No. 3; Jan. 30, 1986; pp. 134-135.

Park et al; "Single Mode . . . External Cavity"; Electronics Letters, vol. 22, No. 21; 10/09/1986; pp. 1132-1133.

"Tunable Fibre-Extended-Cavity Laser", *Electronic Letters*, 3/26/87; vol. 23 No. 7; Whalen et al; pp. 31-314.

"Wavelength-Tunable Single-Mode Fibre Grating Reflector", *Electronic Letters*, 11/20/86; vol. 22, No. 24; Whalen et al; pp. 1307-1308.

*Primary Examiner*—Frank Gonzalez
*Attorney, Agent, or Firm*—John A. Frazzini; William H. F. Howard

[57] ABSTRACT

A broadband-tunable external fiber-cavity laser system includes a laser diode, and a single-mode optical fiber with an in-line fiber optic grating filter. The grating filter includes a grating with divergent ridges so that the periodicity at an exposed evanescent field can be adjusted by translating the grating transversely with respect to the fiber. The evanescent field of light transmitted along the fiber core is accessed at a side-polished region. The laser preferentially oscillates at the reflected wavelength, so that the laser output is tuned by moving the grating. The grating is manufactured by oblique exposure to a holographic wavefront, producing the divergent pattern.

29 Claims, 6 Drawing Sheets

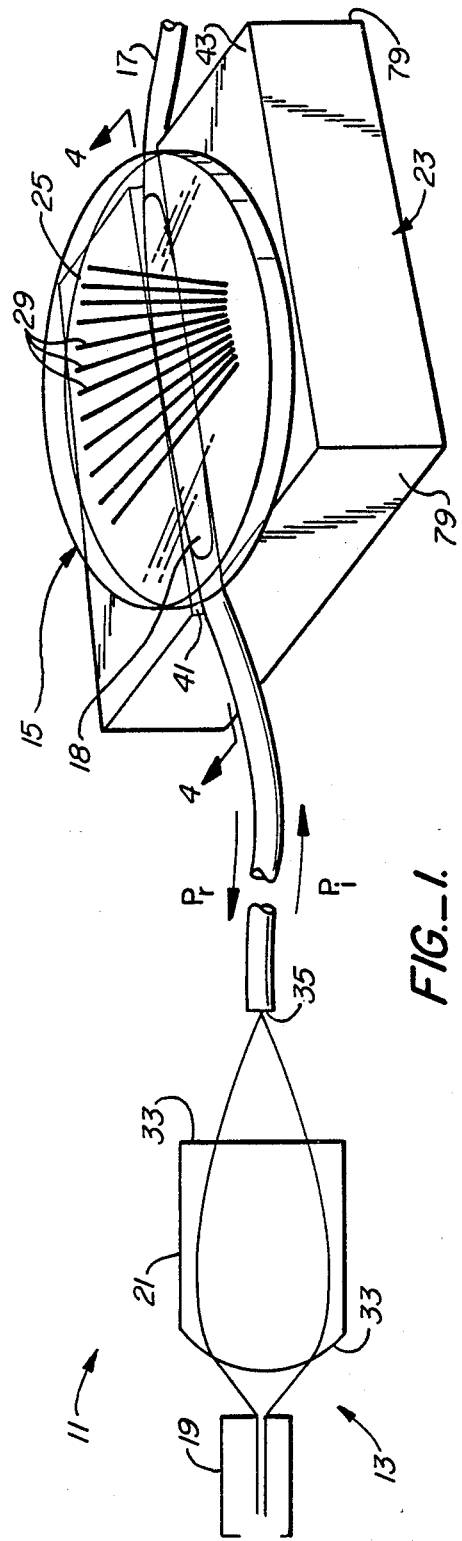
FIG._1.
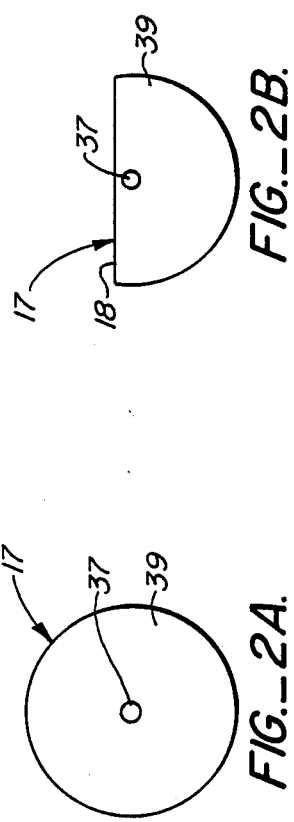
FIG._2B.
FIG._2A.

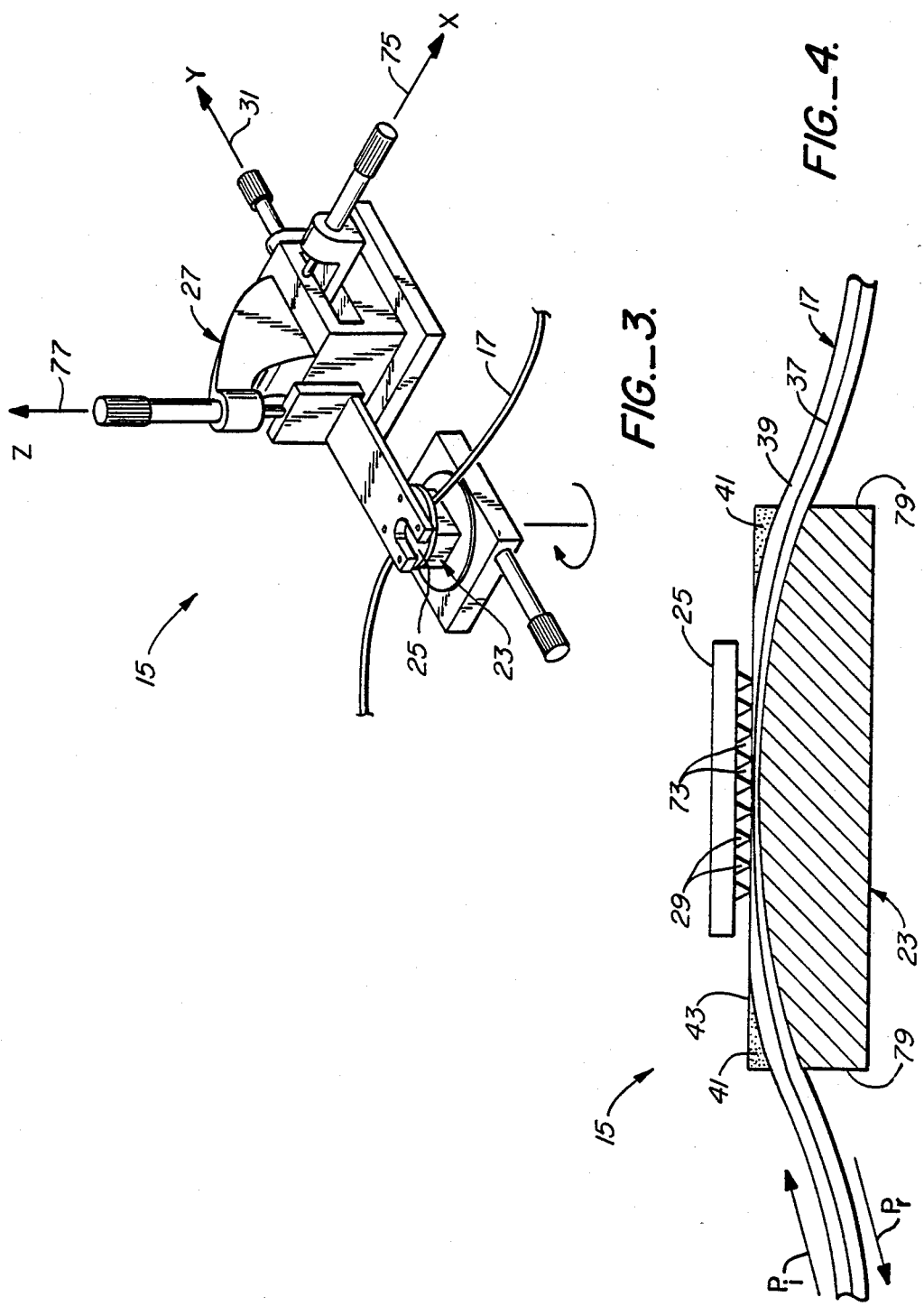

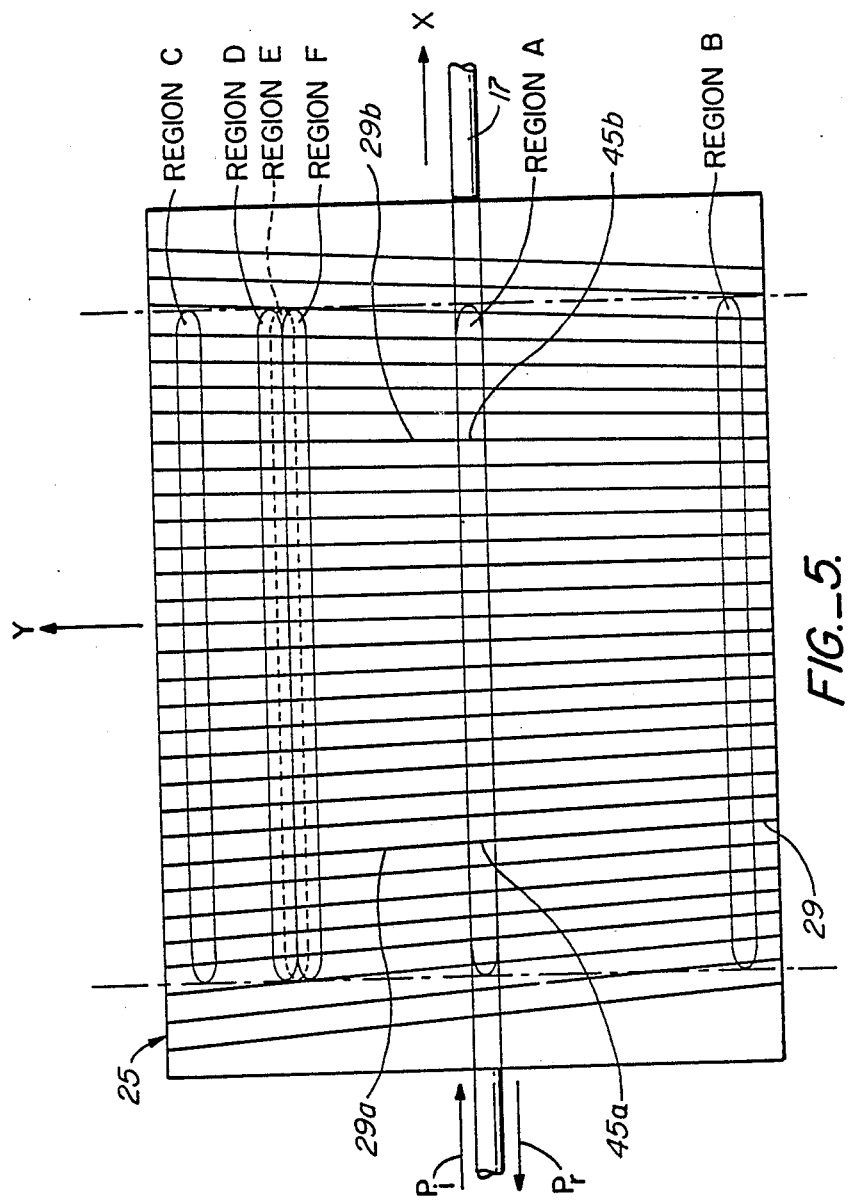
FIG._5.

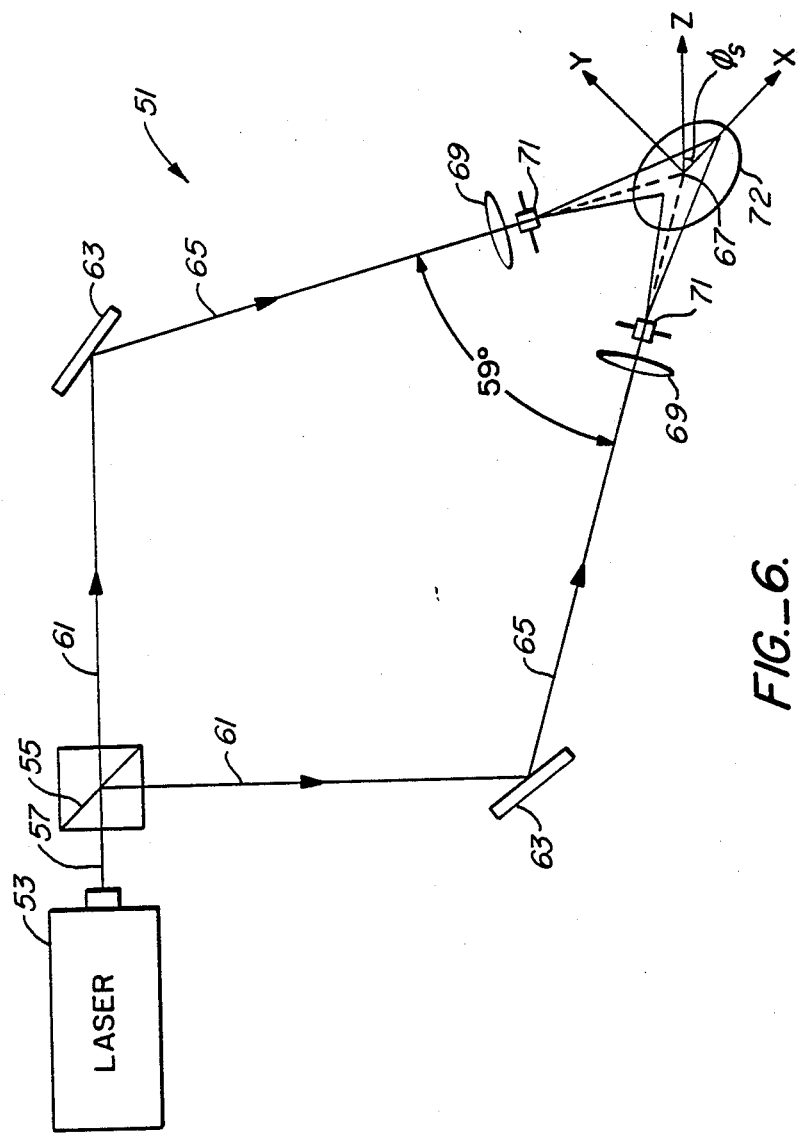
FIG._6.

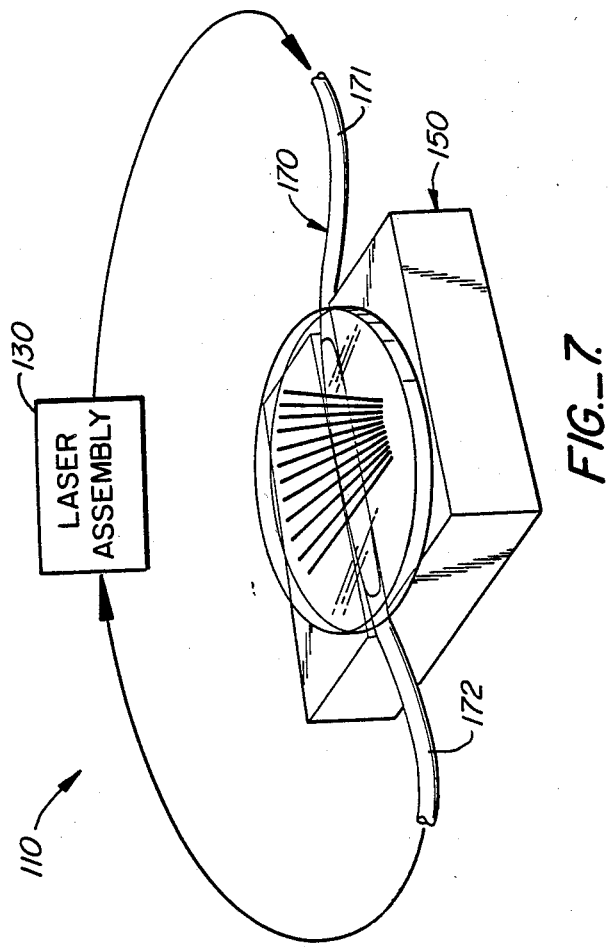

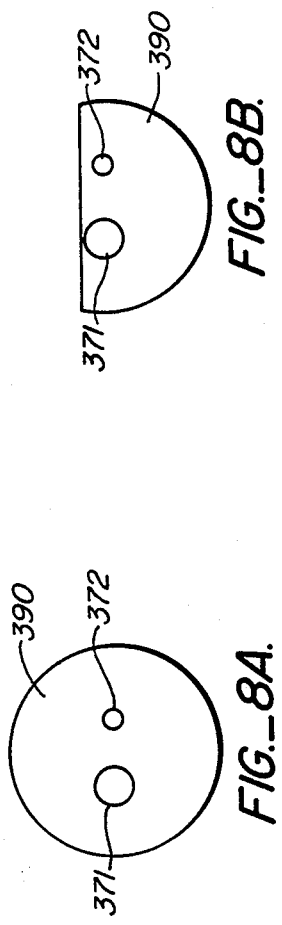
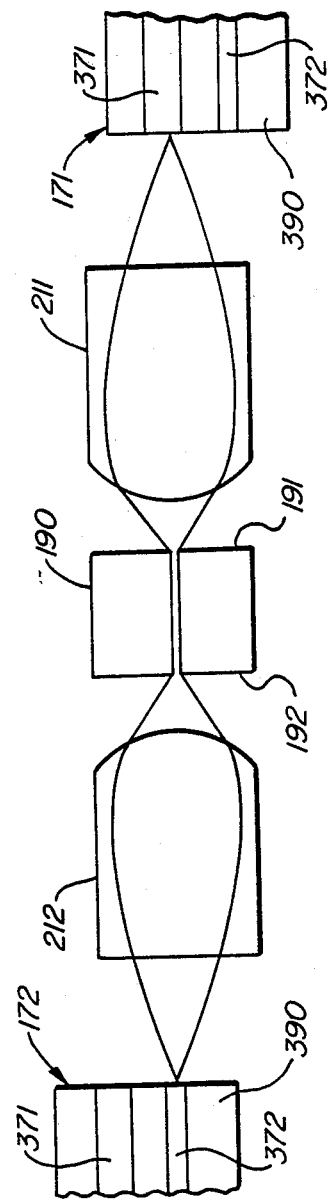

BROADBAND-TUNABLE EXTERNAL FIBER-CAVITY LASER

BACKGROUND OF THE INVENTION

The present invention relates to lasers, and, more particularly, to lasers which are tunable by means of filtered feedback.

Lasers emit electromagnetic radiation, "light" herein, over a characteristic bandwidth. A laser medium is often cable of lasing at a plurality of wavelengths. For example, the gain medium of an infrared semiconductor laser can support emissions over a range of roughly 500 Angstroms (Å). In applications requiring laser emissions at a single predetermined wavelength, it is often necessary to tune a laser.

Tuning can be accomplished in principle by filtering light emitted by a laser source and feeding the filtered light back to the laser cavity. This feedback can have the effect of favoring resonance at the filtered bandwidth, which thus can dominate the laser output. Accordingly, wavelength selective feedback can cause the laser to oscillate at a single wavelength. Tuning of the laser is accomplished by controlling the wavelength of the filtered feedback signal.

Such feedback has been provided in the case of laser diodes by the use of feedback from an "external cavity". In a bulk optic external cavity laser, the output is collimated with a lens and sent to an angled diffraction grating. A narrow band of wavelengths is diffracted from the grating back along the path of the incident beam. The reflected beam is then coupled back into the laser cavity through the lens. The angle of the grating can be varied to control the wavelength of the light fed back to the laser. Accordingly, the laser can be tuned by rotating the diffraction grating.

The bulk optics approach has several disadvantages, especially in the context of diode-based lasers. Due to the small mode diameter of a laser diode, usually less than 4 microns ($\mu$m), it is difficult to couple the difracted signal stably into the laser cavity.

This stability problem is exacerbated when tuning the laser since the grating angle must be varied without inducing any other rotations or offsets to the grating. Decoupling tuning angle motion from other grating motions requires very stringent mechanical tolerances.

Due to the sensitive coupling, mechanical stability is also a problem. Shocks or bumps can disturb the optical coupling if great care is not taken in the mechanical design. Also, considerable space is required for the external grating and lens, making the assembly rather bulky.

The problems due to coupling are partially addressed by coupling the laser diode to an optic fiber which can serve as the external cavity. Where the filtering of light in the fiber involves removing the light and then reintroducing the filtered light into the fiber, the problems with coupling sensitivity are simply translated from one interface to another. However, the problems with coupling have been alleviated by the development of filters which operate on the light without removing it from the fiber.

The use of such an in-line filter for line-narrowing of a laser has been demonstrated by E. Brinkmeyer, W. Brennecke, M Zürn and R. Ulrich, as reported in "Fibre Bragg Reflector for Mode Selection and Line-Narrowing of Injection Lasers", Electronic Letters, Vol. 22, No. 3, Jan. 30, 1986, pp. 134–135. Brinkmeyer et al. disclose a laser diode coupled to an optic fiber with a reflective grating filter attached. The grating filter is disposed over a side-polished region of the fiber so that the evanescent field of light transmitted along the fiber core can interact with the periodic grating structure. The periodicity of the grating determines the wavelength of the reflected light, which in turn determines the narrowed resonance band of the laser diode.

The grating for such a filter can be fabricated using well-known holographic techniques. The interference front generated by a coupled pair of collimated laser beams can produce a series of generally parallel interference lines. These lines can be used to expose a photoresist coated substrate. The exposed substrate can be processed so that the interference pattern is represented as ridges on the finished grating.

The disclosed laser and fiber optic feedback system is limited, however, in that variable tuning is not provided. Thus, to select different output bands, the filter would have to be replaced by another with a different periodicity. To obtain a flexible tuning range and precision, a user would have to have a number of calibrated gratings available, along with a convenient means for exchanging them. Spectral sweeps, for example, are largely precluded.

A very limited form of tunability in a laser with a fiber grating external cavity is reported by C.A. Park et al., in "Single-Mode Behavior of a Multi-Mode 1.55$\mu$m Laser with a Fibre Grating External Cavity", Electronics Letters, Vol. 22, No. 21, Oct. 9, 1986, pp. 1132–1133. Here, tuning was accomplished both by varying the refractive index of oil between a grating and a side-polished fiber and by thermally expanding the grating to increase its spatial periodicity. However, neither method provided a tuning range much greater than the bandwidth selected by the grating filter.

Furthermore, these approaches are disadvantageous because of the complexities and side effects involved. Changing the refractive index of the oil generally requires flushing out oil of one refractive index and replacing it with an oil of another refractive index. The hydraulics required for real-time tuning are impractical. Varying the temperature of the grating over the 40° C. temperature range required to achieve even narrow band tuning is expensive to implement, especially given the need to control side effects of the temperature changes on other components of the laser system.

It is also possible to tune a fiber filter over a narrow band by rotating the filter relative to the fiber. However, the quality of the reflected signal diminishes with rotation angle, so this approach is self-limiting and self-compromising.

While narrow band tuning can preferentially select a given band while rejecting adjacent bands, the capability to select the given band is largely absent or severely limited. What is needed is a broadband tunable laser in which the given band can be selected over a range large compared to that defined by a single band and its immediate neighbors. Preferably, a laser should be tunable over the bandwidth of the laser medium, or at least over a bandwidth comparable to that of the laser medium.

SUMMARY OF THE INVENTION

A laser system tunable over a range much larger than its instantaneous bandwidth comprises a laser source with an external fiber cavity including a broadband tunable filter. Appropriate couplers are provided between the laser and one or more fibers and between a fiber segment and the filter.

In several embodiments of the present invention, the filter uses a grating with plural regions, each region including approximately parallel segments. Filtering is effected by placing a region in a position to interact with the evanescent field of light being transmitted along a fiber. Different regions of the grating are characterized by different spatial periodicities, so that the periodicity of the interaction with the evanescent field can be changed by moving the grating so as to change the region in a position to interact with the evanescent field.

For example, the grating can include a multitude of slightly diverging ridges which extend primarily transversely with respect to a fiber, the elongated dimension of which is used to define a longitudinal direction. The fiber is side-polished or otherwise thinned at the grating so to provide access to the evanescent field. The divergence of the ridges is slight enough so that over a transverse distance comparable to the core diameter, the ridge segments in a position to interact substantially with the evanescent field are virtually parallel. However, the product of the divergence and the transverse dimensions of the grating is large enough to provide for broad band tuning. Tuning can be effected by mounting the grating on an xyz-translation stage, and using one axis, e.g., the y-axis, to control the spatial periodicity of the grating at the evanescent field.

Such a grating can be used for either reflective filtering or transmissive filtering, depending on the mathematical relationships between spatial period at the wavelength or wavelengths involved in the filtering process. To implement a first-order reflective filter, the periodicity can be set to, for example, one-half the wavelength to be reflected. Other fractions can be used for filters of different orders. Advantageously, an embodiment using this reflective approach can use a single-mode fiber for more precise control of the wavelengths involved.

Light generated by the laser source can then be coupled to a fiber cavity of appropriate length to establish resonance. The filter reflects only light of the desired wavelength, and this filtered light is fed back to the laser. This feedback causes the laser to resonate preferentially at the fed back wavelength so that by tuning the filter, the laser is tuned.

The grating for the filter can be manufactured using a modification of techniques used in fabricating gratings with parallel ridges. However, instead of orienting the grating substrate orthogonal to a holographic front generated by collimated beams, the substrate is tilted with respect to an interference front generated by spherically diverging beams so that the interference lines at the substrate diverge.

One device manufactured according to the foregoing description provided a laser tuning range of 260 Å relative to a 6 Å maximum bandwidth for the filter over the tuning range. Thus, a broadband-tunable external fiber-cavity laser is provided. The advantages include improved mechanical stability, relaxed mechanical tolerances, and reduced physical size and weight.

In addition, the invention provides for a multitude of embodiments, each with respective advantages. Further advantages of the preferred embodiment and certain alternative embodiments are apparent in the course of the detailed description below in conjunction with the following figures.

BRIEF DESCRIPTION OF THE DRAWINGS

FIG. 1 is a schematic illustration of a first laser system in accordance with the present invention.

FIGS. 2A and 2B are sectional views of a fiber of the laser system of FIG. 1, taken respectively away from and near the center of a filter assembly of FIG. 1.

FIG. 3 is a perspective view of the filter assembly of FIG. 1 shown together with a translation stage for tuning the filter.

FIG. 4 is a schematic side view of the subassembly of FIG. 1.

FIG. 5 is a schematic plan view of a grating of the subassembly of FIG. 4.

FIG. 6 is a schematic view of an apparatus for manufacturing the grating of FIG. 5.

FIG. 7 is a schematic illustration of second laser system in accordance with the present invention.

FIGS. 8A and 8B are sectional views of a dual-core fiber of FIG. 7, taken respectively away from and near the center of the filter assembly.

FIG. 9 is a schematic illustration of a laser assembly of the system of FIG. 7.

DESCRIPTION OF THE PREFERRED EMBODIMENTS

A laser system 11 includes a laser assembly 13 and a filter 15 connected via an optical fiber 17, as shown in FIG. 1. The laser assembly 13 includes a laser diode 19 and a lens 21 for coupling the laser diode 19 with the optical fiber 17. The filter 15 comprises, a block 23 for retaining the fiber 17, a grating 25 for interacting with a side-polished region 18 of the fiber, and a translation stage 27 for moving the grating relative to the fiber, as shown in FIG. 3. The grating 25 has gradually diverging ridges 29 which extend substantially transversely of the fiber 17, as best shown in FIG. 1. The filter 15 is tuned by operating the Y-control 31 of the translation stage 27, thereby changing the spatial periodicity of the grating 25 at the side-polished region 18.

The illustrated laser diode 19 is a 1.3 μm double-channel planar buried-heterostructure laser diode. The lens 21 is a plano-convex, high-numerical-aperture graded index rod lens. The rod lens facets 33 and the adjacent fiber end 35 are coated with antireflection film to suppress reflection back to the laser diode 19.

The preferred grating 25 is a first-order grating, i.e., its spatial periodicity is nominally half the wavelength of the mode to be reflected. By using this first-order grating, higher order diffraction modes, which would not be captured by the single-mode fiber 17, are eliminated.

The preferred fiber 17 is designed to propagate a single mode in the wavelength range about 1.3 μm of the laser diode 19. In contrast to a multimode fiber, a single mode fiber provides for precise control of transmitted light since the single propagated mode can be operated on with negligible broadening due to other propagation modes.

The fiber 17 includes a core 37 surrounded by a cladding 39, as shown in FIG. 2A and 2B. The fiber 17 is shown fixed in position within an arcuate groove 41 of the block 23, as shown in FIG. 4. At the center of the side-polished region 18, the cladding 39 is thinned insofar as possible without breaching the integrity of the core 37. Preferably, the minimum thickness of the cladding 39 at its side-polished region 18 is less than or at most comparable to the diameter of the core 37.

The purpose of this side-polished region 18 is to permit the evanescent field of incident light $P_i$ being transmitted along the core 37 to protrude from the fiber 17 to interact with the grating 25 to produce a reflection $P_r$. The intersection of such an evanescent field with the surface of the cladding 39 is contained within the side-polished region 18, which thus can be used to locate roughly the exposed evanescent field. Specifically, the region of interaction of the evanescent field with the grating is generally confined to the orthogonal projection of the side-polished region 18 onto the grating 25. Several projection regions A, B, C, D, E and F, corresponding to different transverse positions of the grating 25, are indicated in FIG. 5.

However, a more precise definition for a region of interaction at the grating is available. For a given grating position, at some point on the grating, the evanescent field of light being transmitted along the core achieves maximum strength. A "half-power interaction region" can be defined as that region in the plane of the grating in which the evanescent field is half or more of its maximum. Herein, a region of the grating is said to substantially contain the intersection of the grating and the evanescent field when the region contains the half-power region of the evanescent field defined in the plane of the grating.

This half-power interaction region is much smaller than the side-polished region 18 of the fiber 17. Roughly, the half-power interaction region at the plane of the grating is one-tenth as long and as wide as the side-polished region, so that the area of the half-power interaction region is about one-hundredth that of the side-polished region in the illustrated embodiment.

The dimensions of the evanescent field can be roughly determined by comparison with a fiber assessed by R.A. Bergh et al., in "Single-Mode Fibre Optic Directional Coupler", Electronics Letters, Vol. 16, No. 7, Mar. 27, 1980. The half-power region of a half-coupler assembly, similar to the one illustrated herein was found to extend about 2.5 millimeters (mm) along the fiber and between one and two core diameters transverse to the fiber. This very small transverse extent contributes to the fact that the diverging ridges 29 can be considered parallel for fixed positions of the grating 25, as discussed below.

As illustrated in FIG. 5, the grating 25 includes several regions A, B, C, D, E and F. The multiple ridges 29 are shown gradually diverging so that spatial periodicity increases as a function of transverse position. Thus, of the illustrated regions, region A has an intermediate spatial periodicity, region B has the smallest spatial periodicity, and region C has the greatest spatial periodicity.

The many regions, including those not separately illustrated, define a continuum extending transversely of the fiber 17 in the Y direction. Regions overlap, as shown in conjunction with regions D, E and F. BY translating the grating 25 in the Y direction and thereby selecting the grating region to be positioned over the half-power interaction region of the fiber, the periodicity experienced by light transmitted along the fiber is changed.

Since the divergence of the ridges 29 is continuous, the tuning function is a monotonic one-to-one mapping of grating position to reflected wavelength. Alternatively, step functions and non-monotonic functions are provided for in other embodiments.

Note that while the ridges 29 are clearly diverging, the segments 45a and 45b of ridges 29a and 29b within region A are very nearly parallel. FIG. 5 is necessarily schematic and cannot do justice to the degree of parallelism. The degree of divergence is exaggerated by roughly a factor of 1000 in FIG. 5.

The regions A–F can be equated conservatively with projections of the side-polished region 18 of the fiber 17. However, it is more pertinent to equate the regions A–F with the half-power interaction region. The width of the side-polished region is exaggerated by a factor of about 32, so that the width of the half-power interaction is about 400 times thinner than the width of the illustrated regions A–F. Parenthetically, FIG. 5 shows only about one of every 9000 grating lines.

Considering the exaggeration of divergence and the half-power interaction region together, the percentage change in spatial periodicity over the width of an evanescent field is about 400,000 times greater than indicated in FIG. 5. Thus, the geometry of the grating 25 provides for highly parallel ridge segments in the half-power interaction region, while permitting sufficient divergence for broadband tuning, as detailed below after the following description of the method used to manufacture the illustrated grating 25.

A grating such as grating 25 can be fabricated on a fused quartz substrate 72, which can be one inch square with one surface polished flat. The fused quartz substrate 72 is used for the grating to prevent energy loss of the guided optical signal due to coupling to radiation modes in the substrate 72. This is accomplished since the refractive index of the fused quartz is lower than the effective index of the guided mode.

A thin film of amorphous silicon can be sputtered onto the polished surface; the film can be about 0.3 μm thick. Silicon is used for the grating structure since it has a large refractive index -and has relatively low absorption losses at the infrared wavelengths, 13,000 to 15,500 Å, of interest. The large index of refraction difference between the amorphous silicon and the fused quartz contributes to an increased reflection coefficient.

Photoresist can then be spun onto the amorphous silicon. The photoresist can be a positive photoresist such as Shipley AZ1350, but alternative positive and negative photoresists can be accommodated. The photoresist layer can be about 0.4 μm thick.

The photoresist coat can then be exposed holographically using a largely conventional apparatus 51 illustrated in FIG. 6. A holographic interference pattern is initiated by a laser source 53, which in the illustrated embodiment is a Helium-Cadmium, HeCd, laser with a nominal wavelength of 4416 Å. A half-silvered mirror 55 is used to split the laser beam 57 into two substantially equal and mutually perpendicular component beams 61.

Respective mirrors 63 are then used to reflect the component beams 61 so that the redirected component beams 65 define a predetermined angle with respect to a point of virtual convergence 67. The point of convergence 67 is virtual in that respective lenses 69 and diffraction pin-holes 71 disturb the redirected component beams 65 before they reach the would-be point of convergence.

The angle of convergence is selected to provide a standing wave interference pattern. The appropriate angle is determined as a function of the laser wavelength as is well-known in the art. In the illustrated embodiment, the 4416 Å wavelength of the HeCd laser source 53 requires an angle of convergence of about 59° to optimize the desired holographic interference pattern.

The redirected component beams 65 are focussed at their respective pin-holes 71 by respective lenses 69. The pin-holes 71, which in the illustrated apparatus are about 2.5 μm in diameter, serve as coherent point sources of spherically diverging wavefronts. As is well known, the wavefronts thus created interfere to produce an interference pattern at the substrate surface.

As in the fabrication of a conventional holographic grating, the coated substrate 72 is positioned about the point of convergence 67. However, in accordance with the present invention, the substrate 72 is tilted about 30° with respect to the wavefront interference plane.

To establish a frame of reference, let the point of convergence 67 be an origin, with a line bisecting 59° angle defining the x-axis; the y-axis is then as illustrated in FIG. 6, and the z-axis is orthogonal to the page. Diverging beams, rather than the conventional collimated beams, are used to generate a diverging interference pattern. The degree of divergence at the substrate can be adjusted by rotating the it from the yz-plane of the interference front as indicated in FIG. 6.

This tilt causes a lower portion of the substrate 72 to be nearer the pin-holes 71 and an upper portion to be further from the pin-holes 71. Since the interference pattern diverges away from the pin-holes, a diverging interference pattern is imposed on the photoresist. Those skilled in the art understand that the interference lines are hyperbolic rather than straight. However, straight lines are sufficiently approximated not only over the width of the half-power interactions regions, but also over the tuning range of the grating.

The strips of photoresist exposed to lines of constructive interference are then removed from the substrate 72 by conventional methods. The photoresist pattern is then transferred to the amorphous silicon using a selective reactive ion etch. A gas such as carbon tetrafluoride can be used in the etch. Finally, the remaining photoresist is removed. The resulting grating 25 has a spatial period of approximately 0.45 μm with a divergence of about 3.4 microradians.

The resulting grating 25 is then mounted on the xyz-translation stage 27 and placed ridges down onto the side-polished optical fiber 17 to allow for evanescent interaction. An index matching oil 73, shown in FIG. 4, is preferably applied between the fiber 17 and the grating 25 to remove any possible air gaps which would reduce the extent of the evanescent field.

The grating 25 is longitudinally centered on the side-polished region 18 of the fiber 17 with its ridges 29 extending substantially transversely of the fiber 17. The x-control 75 of the translation stage 27 is used to center the grating 25 in the x-direction. The z-control 77 of the translation is adjusted to apply sufficient pressure to ensure firm contact between grating 25 and the fiber 17. As indicated above, the y-control 31 is used for tuning.

The block and fiber assembly can be fabricated as provided by Bergh et al., cited above. For completeness, the process is outlined herein. Since, Bergh et al. use two such assemblies to constitute a directional optical coupler, the block and fiber 17 can be referred to collectively as a "coupler half".

The coupler half includes the block 23 and the side-polished fiber 17. The groove 41 is cut or etched into the flat top surface 43 of the block 23 between two end surfaces 79 such that the depth of the groove 41 with respect to the top surface 43 is greater near the two end surfaces 79 than it is midway between the two end surfaces 79. Preferably the depth of the groove 41 varies gradually such that the groove 41 is arcuate between the two end surfaces 79 as shown in FIG. 4.

The fiber 17 is preferably a standard single-mode telecommunications fiber used, for example, for the 13,000 to 15,500 Å wavelengths. The fiber 17 has an inner core 37 and an outer cladding 39. The inner core 37 has a higher refractive index than the outer cladding 39 so that light propagating within the inner core 37 of the optical fiber 17 is guided. The diameter of the core 37 of the illustrated fiber 17 is 10 μm, while the cladding 39 has a diameter of 125 μm The fiber 17 is placed within the groove 41 with the axis of the optical fiber 17 extending between the two end surfaces 79. The depth profile of the groove 41 is selected to be greater at the end surfaces 79 than the diameter of the outer cladding 39 of the optical fiber 17. The depth of the groove 41 midway between its ends is selected so that it is approximately equal to the diameter of the outer cladding 39 so that the fiber 17 extends about to the surface of the block 23 at its midpoint.

The optical fiber 17 is held in place in the groove 41 by an epoxy or other suitable adhesive. Thereafter, the top surface 43 of the block 23 and any coplanar portions of the cladding 39 are carefully ground and polished so that a portion of the cladding 39 of the optical fiber 17 is slowly thinned. The grinding and polishing is continued until only a small thickness of the cladding 39 covers the inner core 37 of the optical fiber 17 at the approximate mid-point of the block 23.

Preferably, the minimum thickness of the cladding is less than the diameter of the core In the case of the utilized 10 μm core, the minimum cladding thickness can be between 0.5 μm and 5 μm. After the grinding and polishing is completed, the region where the cladding has been removed defines the oval side-polished region 18 which is coplanar with the top surface 43 of the quartz block 23.

The fiber 17 extends about 5 centimeters (cm) between the laser assembly 13 and the grating 25, yielding an effective cavity length of about 10 cm. The effective cavity length constrains the wavelengths at which the resonance required for lasing can be achieved.

A laser system 110 using a transmissive filter 150 is shown in FIG. 7. In this case, two optical fibers segments 171 and 172, preferably of a single fiber 170, are used to link the filter 150 with a laser assembly 130. The laser assembly 130 transmits to the filter 150 via fiber segment 171, and the signal as filtered by the filter is fed back to the laser assembly via fiber segment 172.

To effect transmissive filtering, a multi-mode fiber can be advantageously employed. The laser output is propagated in one mode, and the filter can selectively couple the transmission to a second mode. The different modes can be characterized, in part, by different propagation speeds.

While, the multi-mode approach can be implemented using a single-core fiber, the advantages of multi-mode and single-mode fibers can be combined in a multi-core fiber. For example, the fiber 170 can have two cores 371 and 372, within a single cladding 390, as shown in FIG. 8a.

The cores 371 and 372 support different single modes within the operating range of the laser system 110. For example, one core 371 can have a larger diameter than the other core 372. Different modes can also be supported where dual cores have different refractive indexes.

The dual-core fiber 170 can be coupled to a grating filter such as shown in FIG. 1, adjacent a side-polished region 180, shown in FIG. 8b, which provides access to evanescent fields from both cores 371 and 372. Thus, the side polishing should be performed with the cores 371 and 372 spaced transversely with respect to each other, as indicated in FIG. 8b.

The coupling between the dual-core fiber 170 and the laser assembly 130 is indicated in FIG. 9. Light exiting a first facet 191 of the laser diode 190 is coupled via a first lens 211 to one core 371. This core 371 supports a first single-mode. The light in this mode is coupled selectively to a second single mode supported by the second core 372. The filtered light in this second mode is fed back to the laser diode 190 through a second facet 192 via a second lens 212.

It is also possible to couple the two modes of a dual-core fiber using an acoustic wave with the appropriate spatial periodicity. In this case, substantial interaction takes place within the cores themselves, and is not limited to the evanescent fields.

Many other combinations of laser assemblies, fibers and filter assemblies are possible. For example, optical rotators, optical analogues of faraday rotators, can be used to couple reflected light to the facet opposite that used to transmit light from a laser diode. Similarly, an optical rotator can be used to feed back transmissively filtered light through the same facet used for transmitting light from the laser diode to the filter.

The laser system can be arranged so that the useful output is taken out a facet not used by the external cavity, or the feedback signal can be a decoupled fraction of a main output. Many different laser diodes or other laser sources can be used, as can many means for coupling the laser source to the optical fibers. The invention provides for lenses with different geometries, constituents, and index profiles.

The fiber, can be single mode or multiple mode, or a combination of single and multimode segments can be used. The fiber can be single core or multiple core. A multiple core fiber can be implemented so that each core supports a single respective mode, or so that at least one core supports multiple modes.

The filter can use a grating, or other broadband tunable means for imposing a periodic perturbation on the evanescent field or fields of the fiber. Access to evanescent fields can be through a side-polished or otherwise thinned region of the fiber.

The geometry of the grating and the tuning motion can be coordinated in a variety of ways. A grating which could be tuned by longitudinal translation would have series of parallel ridges, with different series characterized by different spatial periodicity. In other words, the regions characterized by different periodicity would be disposed longitudinally of each other. The relationship between spatial periodicity and longitudinal position could be a step function or a continuous function. Generally, all the ridges would extend over the fiber at all times, but only those over the side-polished region would interact with the evanescent field. Alternatively, various radially arranged gratings are provided for so that tuning can be effected by rotating a grating.

The foregoing and other modifications and variations are provided for by the present invention, the scope of which is limited only by the following claims.

What is claimed is:

1. A tunable external fiber-cavity laser system comprising:
   laser means for generating light within a predetermined wavelength range;
   fiber means for the guided propagation of light within said predetermined wavelength range, said fiber means including at least one optical fiber;
   laser-fiber coupling means for coupling said laser means and said fiber means so that they are in mutual optical communication;
   adjustable filter means for in-fiber filtering of light being transmitted along said fiber means, said filter means being adapted for separating light of a predetermined maximum bandwidth within said predetermined wavelength range from light being transmitted along said fiber means, said filter means being adjustable over a tuning range substantially greater than said maximum predetermined bandwidth;
   filter-fiber coupling means for coupling said filter means and said fiber means so that the field of light being transmitted along said fiber means can interact with said filter means to effect in-fiber filtering; and
   tuning means for tuning said filter means over said tuning range, said filter-fiber coupling means, said fiber means, said laser-fiber coupling means and said laser means being mutually selected and arranged so that light selected by said tuning means for separation by said filter means is fed back to said laser means so that said laser means preferentially lazes at the frequency of said selected light.

2. The laser system of claim 1 wherein said laser means includes a laser diode.

3. The laser system of claim 1 wherein said fiber means includes exactly one fiber.

4. The laser system of claim 1 wherein said fiber means includes at least two fibers spliced together.

5. The laser system of claim 1 wherein said fiber means includes a core and a cladding.

6. The laser system of claim 1 wherein said fiber means includes plural cores and a common cladding.

7. The laser system of claim 1 wherein said fiber means supports exactly one propagation mode within said predetermined wavelength range of said laser.

8. The laser system of claim 1 wherein said fiber means supports multiple propagation modes within said predetermined wavelength range of said laser, said modes having different respective propagation speeds.

9. The laser system of claim 1 wherein said fiber means includes plural cores, each core supporting exactly one respective propagation mode within said predetermined wavelength range of said laser so that said fiber means supports at least two propagation modes with different respective propagation speeds.

10. The laser system of claim 1 wherein said laser-fiber coupling means includes at least one interface between said laser means and said fiber means for optical communication therebetween.

11. The laser system of claim 1 wherein said laser-fiber coupling means includes plural interfaces between said laser means and said fiber means for optical communication therebetween, at least one of said interfaces being arranged for transmission of light from said laser means to said fiber means, at least another of said interfaces being arranged for transmission of light from said fiber means to said laser means.

12. The laser system of claim 1 wherein said fiber means includes at least one fiber end, wherein said laser means includes at least one transmissive surface area, and wherein said laser-fiber coupling means includes means for coupling said at least one end to said at least one transmissive surface area.

13. The laser system of claim 1 wherein said fiber means includes plural fiber ends, wherein said laser means includes plural separate transmissive surface areas, and wherein said laser-fiber coupling means includes means for coupling a first of said ends to a first of said areas and means for coupling a second of said ends to a second of said areas, said laser means, fiber means, filter means, said filter-fiber coupling means and said laser-fiber coupling means being cooperatively arranged so that light is transmitted from said laser means into said fiber at said first end, and so that filtered light is transmitted from said fiber into said laser source through said second end.

14. The system of claim 1 wherein:
said filter means includes a grating with plural elongated regions and plural ridges, said elongated regions sharing a common predetermined width, said elongated regions sharing a common predetermined length, each said region intersecting plural of said ridges to define a series of ridge segments, each series so defined extending lengthwise of the defining region, each ridge segment of each said series extending substantially width-wise across said region, each region being characterized by a substantially constant ridge-segment spatial periodicity, with a first region having a different spatial periodicity than at least a second region;
said filter-fiber coupling means includes means for arranging said grating with respect to an optical fiber so that the evanescent field of light being transmitted through said fiber can substantially interact with said grating, and so that the intersection of said grating and such an evanescent field can be substantially contained within at least one of said regions; and
said tuning means includes positioning means for moving said grating relative to said fiber so that at one time said first region can substantially contain the intersection of said grating and the evanescent field of light being transmitted through said fiber, and so that at another time said second region can substantially contain the intersection of said grating and the evanescent field of light being transmitted through said fiber.

15. The system of claim 14 wherein said fiber means includes a single core and supports a single mode in said predetermined wavelength range of said laser means, said grating being arranged to interact with the evanescent field of light being transmitted in a first direction along said core so that a portion of said light is reflected back along said core in the opposite direction, said fiber means including at least one end, said laser means including at least one transmissive surface area, said laser-fiber means including an interface between said end and said area so that light generated by said laser means can be transmitted into said fiber across said interface, and so that light reflected by said filter means can be transmitted into said laser source across said interface.

16. The system of claim 14 wherein said fiber means supports multiple modes in said predetermined wavelength range of said laser means, said grating being arranged to interact with the evanescent field of a single transmission mode so as to couple a portion of the energy of that single mode into a second mode supported by said fiber means, said first and second modes being characterized by different speeds.

17. The system of claim 16 further characterized in that said grating is arranged so that said coupled portion of energy is propagated along the same direction as the transmission in said first mode, said fiber means including plural ends, said laser means including plural separate transmissive areas, said laser-fiber coupling means including an outgoing interface between a first of said ends and a first of said areas through which light generated by said laser source can be transmitted into and along said fiber and to said filter means, said laser-fiber coupling means also including a feedback interface between a second of said ends and a second of said areas through which filtered light is fed back from said filter means.

18. The system of claim 16 wherein said fiber means includes at least two cores, each core being adapted for supporting a respective single mode at a given wavelength band, said modes being characterized by different propagation speeds, said grating being arranged to couple part of the energy propagated in one of said cores to the other of said cores.

19. The system of claim 1 wherein:
said fiber means includes first and second fiber ends and has an inner core and an outer cladding, a portion of said outer cladding being thinned at a location intermediate to said first and second ends of said fiber means to define an area thereon through which the evanescent field of light being transmitted along the core of said fiber can emanate;
said filter means includes periodic refractive perturbation means for introducing a variation in refractive index as a periodic function of longitudinal position along said thinned portion of said outer cladding, the periodicity of said perturbation means at said thinned portion being a function of the relative position of said perturbation means and said thinned portion;
said filter-fiber coupling means couples said perturbation means to said thinned portion so that said perturbation means can interact with the evanescent field of light being transmitted along the core of said fiber; and
said tuning means includes positioning means for variably positioning said perturbation means relative to said thinned region.

20. The system of claim 19 wherein said fiber means is characterized by a single core and supports a single mode within the predetermined wavelength range of said laser means, said perturbation means being arranged to interact with the evanescent field of light being transmitted in a first direction along said core so that a portion of said light is reflected back along said core in the opposite direction.

21. The system of claim 19 wherein said fiber means supports multiple modes in within the predetermined wavelength range of said laser means, said perturbation means being arranged to interact with the evanescent field of a single transmission mode so as to couple a portion of the energy of that single mode into a second mode supported by said fiber means.

22. The system of claim 21 wherein said perturbation means is arranged so that said coupled portion of energy is propagated along the same direction as the transmission in said first mode.

23. The system of claim 21 wherein said fiber includes at least two cores, each core being adapted for supporting a respective single mode at a given wavelength band, said modes being characterized by different speeds, said perturbation means being arranged to couple part of the energy propagated in one of said cores to the other of said cores.

24. The system of claim 19 further characterized in that said perturbation means includes a grating.

25. The system of claim 19 wherein said grating includes gradually diverging ridges which extend substantially transversely to said optical fiber when coupled thereto by said filter-fiber coupling means.

26. The system of claim 25 wherein said positioning means includes means for moving said grating transversely with respect to said thinned portion of said fiber to vary the periodicity of perturbation to an evanescent field of light being transmitted along said core.

27. A laser system as in claim 14 wherein said grating ridges are formed as the result of a photoresist process in which a laser beam is split and then recombined to produce a pattern of intensity having diverging lines of peak intensity.

28. A tunable external fiber-cavity laser system comprising:
    laser means for generating light within a predetermined wavelength range;
    fiber means for the guided propagation of light within said predetermined wavelength range, said fiber means including at least one optical fiber;
    laser-fiber coupling means for coupling said laser means and said fiber means so that they are in mutual optical communication so as to define a laser resonance cavity characterized by plural resonance modes within said predetermined wavelength range;
    adjustable filter means for in-fiber filtering of light being transmitted along said fiber means, said filter means being adapted for separating light having a selected frequency and being characterized by a predetermined maximum bandwidth within said predetermined wavelength range from light being transmitted along said fiber means, said predetermined maximum bandwidth being sufficiently small that each individual of said plural resonance modes can be selected for feedback while adjacent modes are rejected, said filter means being tunable over a tuning range large enough so that any one of said plural resonance modes can be selected for feedback;
    filter-fiber coupling means for coupling said filter means and said fiber means so that the field of light being transmitted along said fiber means can interact with said filter means to effect in-fiber filtering so that a selected one of said resonance modes can be fed back to said laser means; and
    tuning means for tuning said filter means over said tuning range, said filter-fiber coupling means, said fiber means, said laser-fiber coupling means and said laser means being mutually selected and arranged so that light selected by said tuning means for separation by said filter means is fed back to said laser means so that said laser means preferentially lazes at the frequency of said selected light.

29. The laser system of claim 28 wherein said filter-fiber means defines a coupling region of said fiber means within which light being transmitted along said fiber means can interact with said filter means to effect in-fiber filtering, said coupling region having a nominal length along the local longitudinal extent of said fiber means and a nominal width transverse to the local longitudinal extent of said fiber means,
    said tunable filter means including a grating with multiple ridge segments extending along paths collectively defined by the intersection of an holographic interference pattern between two spherically diverging wavefronts and a plane oriented obliquely so that said paths are non-intersecting, said multiple ridge segments being disposed generally orthogonally to the local longitudinal extent of said fiber means, said multiple ridge segments being substantially parallel to each other over a distance equal to said nominal width, said multiple ridge segments being even spaced along the local longitudinal extent of said fiber means to define a spatial periodicity at said coupling region.
    said tuning means being adapted for moving said grating generally orthogonally with respect to the local longitudinal extent of said fiber means over a distance large compared to said nominal width so that the spatial periodicity at said coupling region can be varied to select one of said plural resonance modes for preferential feedback to said laser means.

* * * * *